United States Patent [19]

Herron et al.

[11] Patent Number: 5,132,051

[45] Date of Patent: Jul. 21, 1992

[54] III-V SEMICONDUCTORS IN RIGID MATRICES

[75] Inventors: Norman Herron; Ying Wang, both of Wilmington, Del.

[73] Assignee: E. I. du Pont de Nemours and Company, Wilmington, Del.

[21] Appl. No.: 315,630

[22] Filed: Feb. 24, 1989

[51] Int. Cl.$^5$ .............................. A01B 1/06
[52] U.S. Cl. .................. 252/501.1; 252/518; 252/520; 252/521
[58] Field of Search ............. 252/501.1, 518, 520, 252/521; 428/432, 210, 688, 689; 357/8, 10, 23.2, 29, 30, 32; 350/355, 356, 357, 360, 362

[56] References Cited

U.S. PATENT DOCUMENTS

| | | | |
|---|---|---|---|
| 4,569,891 | 2/1986 | Shimizu et al. | 252/501.1 |
| 4,601,965 | 7/1986 | Ide | 252/501.1 |
| 4,658,087 | 4/1987 | Fong | 252/501.1 |
| 4,701,394 | 10/1987 | Inoue et al. | 252/501.1 |
| 4,737,429 | 4/1988 | Mort et al. | 252/501.1 |
| 4,816,183 | 3/1989 | Bates | 252/518 |

OTHER PUBLICATIONS

Mahler, Inorganic Chem., vol. 27, No. 3, 1988, pp. 435-436.
Rajh et al., Chemical Physics Letters, vol. 143, No. 3, 1988, pp. 305-307.
Roy et al., in "Better Ceramic Through Chemistry", Materials Res. Soc. Symp., vol. 32, Ed. J. C. Brinker et al., Elsevier, 1984.
Kuczynski et al., J. Phys. Chem., vol. 89, 1985, pp. 2720-2722.
Rustagi et al., Optics Letters, vol. 9, No. 8 (1984), pp. 344-346.

Primary Examiner—Josephine Barr

[57] ABSTRACT

This invention provides III-V semiconductor/glass and III-V semiconductor/glass/polymer articles of manufacture which are useful for generating third order nonlinear optical effects.

8 Claims, 2 Drawing Sheets

III-V SEMICONDUCTORS IN RIGID MATRICES

FIELD OF THE INVENTION

This invention relates to III-V semiconductor/glass and III-V semiconductor/glass/polymer articles of manufacture.

BACKGROUND OF THE INVENTION

III-V semiconductors are compounds which contain at least one element from Group III of the periodic table and at least one other element from Group V of the periodic table.

Several methods are known for the preparation of III-V semiconductors for applications in solid state electronic devices. For example, many of the III-V semiconductors were first prepared by direct combination of the elements at high temperatures and high pressures. Other routes have been developed to provide purer products and to avoid the hazards associated with earlier routes. Chemical vapor deposition (CVD) or metal organic chemical vapor deposition (MOCVD) have been used to deposit the semiconductors on a heated substrate by contacting the substrate with a gas stream which contains volatile Group III and Group V compounds.

The bulk properties of semiconductors are the properties which are exploited in semiconductor applications such as diodes and transistors. However, it has recently been shown that small-particle semiconductors of many types (I-VI, II-VI, III-VI) exhibit interesting and potentially useful electronic and nonlinear optical effects. The most promising materials incorporating these small-particle semiconductors contain the semiconductor particles embedded in a rigid glass, polymer or glass/polymer matrix.

Several methods have been used to prepare small-particle semiconductors in rigid matrices. In one approach, Cd, S and Se have been added to the standard ingredients of normal glass to prepare CdS or $CdS_xSe_{1-x}$ glass cutoff filters by standard melt procedures. Glasses of this type are commercially available as long-wavelength-pass optical filters with several values for x. Nonlinear optical effects have been reported in these glasses, but the high temperatures and strongly oxidizing conditions used to prepare these glasses preclude the use of this technique for III-V semiconductor compositions.

Mahler, Inorganic Chem., Vol. 27, Number 3, 1988, pp. 435–436. discloses additional preparative methods, including metathesis in microemulsion, gas-solid reactions on high surface area silica, synthesis within the channels of perfluorocarbon sulfonic acid membranes, and generation of semiconductor particles within polymer films. In particular, ethylene-15% methacrylic acid copolymer (E-MAA) was shown to provide good mechanical and optical properties and confer high kinetic stability on nanometer-sized semiconductor particles.

Rajh et al., Chemical Physics Letters, Vol. 143, No. 3, 1988, pp. 305–307, disclose a method for incorporating quantized particles of colloidal semiconductors in transparent silicate glasses by mixing aqueous colloidal dispersrons of the semiconductor with tetramethoxysilane (TMOS), accelerating the polymerization of the silicon alkoxide by the addition of $NH_4OH$, and drying the resulting gel over a period of months. They also disclose a method for producing colloidal glasses by first incorporating metal ions, and then, after drying to about one-half the original volume, adding the appropriate anions for precipitating the particles via gaseous $H_2S$ or $H_2Se$.

Roy et al., in "Better Ceramics Through Chemistry", Materials Res. Soc. Symp., Vol. 32, Ed. J. C. Brinker, D. E. Clark, D. R. Ulrich, Elsevier, 1984, disclose the inclusion of CdS and AgX (X=Cl, Br, I) in sol-gel monoliths by mixing a tetraethoxysilane/ethanol solution with an aqueous solution of the heavy metal ion.

Kuczynski et al., J. Phys. Chem., Vol. 89, 1985, pp. 2720–2722, disclose the preparation of CdS in porous Vycor® glass by soaking cleaned porous glass in a $CdCl_2$ solution, drying the glass under vacuum and then immersing the impregnated sample in a sodium sulfide solution.

Unfortunately, none of these methods is applicable to the preparation of III-V semiconductor/glass or III-V semiconductor/glass/polymer composites because III-V semiconductors are both more difficult to prepare than, for example, II-VI semiconductors and because III-V semiconductors decompose in aqueous solutions. Such composites are desirable because they are expected to exhibit interesting and useful electronic and nonlinear optical effects analogous to those demonstrated for other small-particle semiconductor composites. Embedding the III-V semiconductor particles in a rigid matrix of glass or glass and polymer would also prevent aggregation of the III-V particles.

The nonlinear optical properties of semiconductors such as degenerate four-wave mixing, optical bistability and phase conjugation have been reported (Rustagi et al., Optics Letters, Vol. 9, No. 8 (1984), pp. 344–346, and references therein). Rustagi et al. describe an experimental arrangement for measuring degenerate four-wave mixing of visible radiation in a borosilicate glass doped with mixed semiconductor, $CdS_xSe_{1-x}$.

It is the object of this invention to provide a chemically and mechanically stable dispersion of small III-V semiconductor particles in a rigid matrix. Appropriately made materials should have faster optical nonlinearity than bulk III-V semiconductors. Wavelength tuning can also be conveniently achieved by controlling the size and concentration of the III-V semiconductor clusters. It is a further object of this invention to provide a method for generating third order nonlinear optical effects.

SUMMARY OF THE INVENTION

This invention provides an article of manufacture consisting essentially of a porous glass matrix, the pore of which comprise a III-V semiconductor and, optionally, a polymer. This invention also provides a method of generating third order nonlinear optical effects comprising irradiating said article of manufacture with a source of coherent optical radiation.

DETAILED DESCRIPTION OF THE INVENTION

Figure 1:
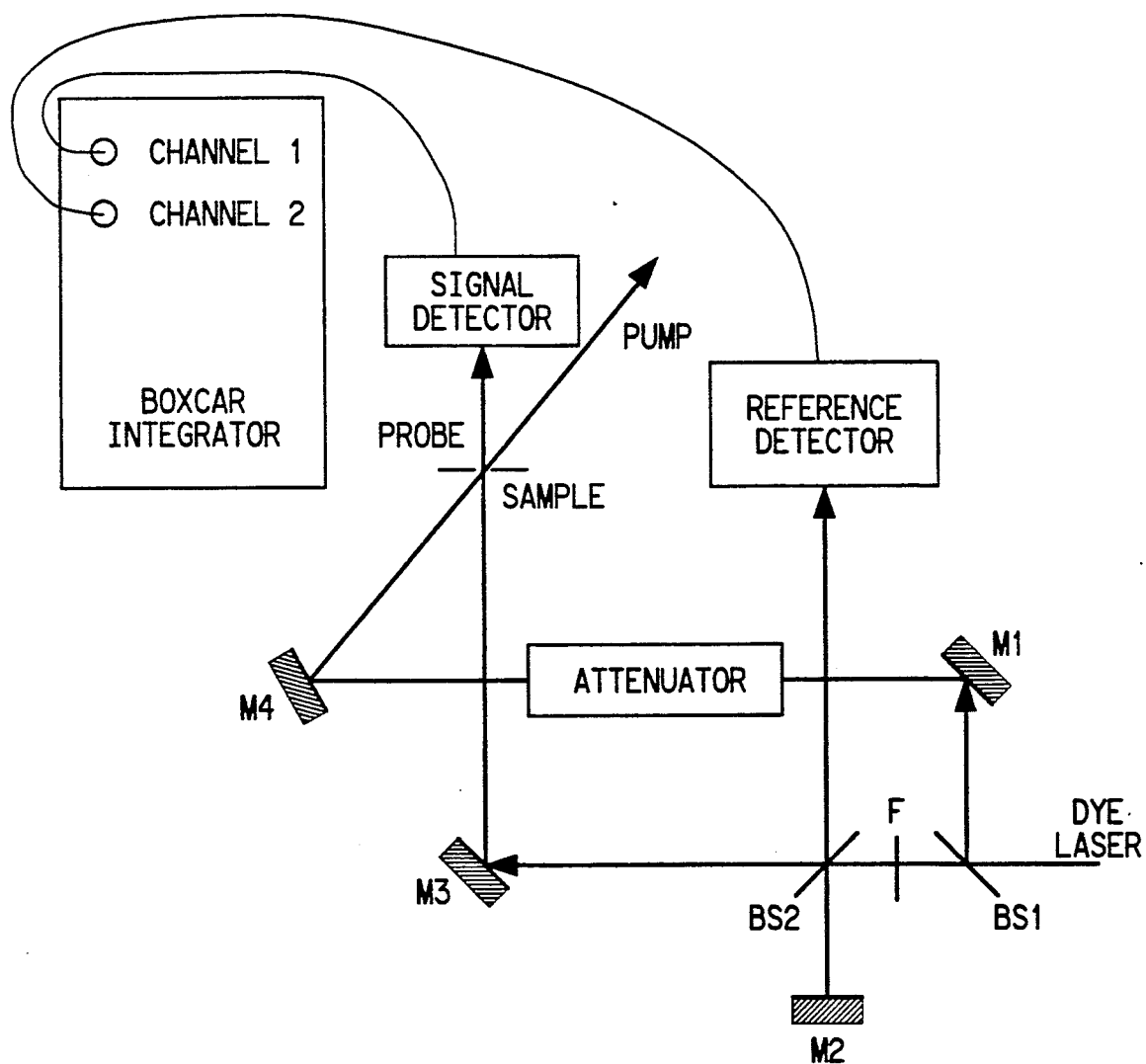
FIG. 1 is a schematic diagram of a Pump Probe Apparatus utilized in Absorption Bleaching Measurements according to the present invention.

Suitable porous glasses are amorphous matrix materials with large (10–500Å), interconnected pores and channels, which may be optionally filled with readily displaceable organic or inorganic compounds, e.g., organic solvents, water, or inorganic salts. Vycor ® (Corning Glass Works, Corning, N.Y.) is a suitable porous glass. Vycor ® glass is a porous silicate glass obtained from heat treated borosilicate glass by removing silica-poor domains by leaching with acid. Suitable porous glasses can also be prepared by the hydrolysis of precursor materials, followed by drying of the resulting gel. The pore size of glasses derived from sol gels can be controlled by the choice of solvents and by the pH of the hydrolysis conditions. Suitable glass precursors include metallic esters or metal alkoxides, $M(OR)_n$ ($n=3,4$; $M=Si$, Al; $R=C_1-C_{10}$ alkyl). Preferred precursors include tetramethyl- or tetraethylorthosilicate, titanium tetra-isopropoxide, titanium tetra-tert-butoxide, titanium tetra-ethoxide and aluminum tri-sec-butoxide. Suitable simple glasses include $SiO_2$, $GeO_2$, $Y_2O_3$ and $ZrO_2$. Suitable multicomponent glasses, e.g., $SiO_2$—BaO, $SiO_2$—$B_2O_3$, $SiO_2$—$B_2O_3$—$Na_2O$, $SiO_2$—$Na_2O$, $Al_2O_3$—$ZrO_2$, $TiO_2$—$ZrO_2$, $ZrO_2$—$SiO_2$ and $PbO$-$La_2O_3$—$ZrO_2$—$TiO_2$ can also be prepared by known methods. The preferred glass is $SiO_2$.

As used herein, the expression "semiconductor material" refers to material that in bulk has electrical conductivity intermediate to that of an insulator and a metal, or a band-gap between about 0.2 and 4 volts. III-V semiconductor materials suitable for use in the present articles of manufacture are known in the art. Preferably, the III-V semiconductor material is selected from the group of cations consisting of $Ga^{+3}$ and $In^{+3}$ in combination with at least one anion selected from the group consisting of $P^{-3}$, $As^{-3}$, and $Sb^{-3}$. Most preferably, the III-V semiconductor is selected from the group consisting of GaAs, GaP, InAs and InP. The semiconductor material can contain mixtures or solid solutions derived from two or more cations listed above. The concentration of the III-V semiconductor in the glass-/semiconductor or glass/semiconductor/polymer composite ranges from 0.1-10 wt. %, based on semiconductor-to-glass ratios.

It has been found that the band-gap energy of the semiconductor particles in the porous glass depends on the size of the particles, which can be controlled by size of the pores in the porous glass and by the time and temperature of annealing the III-V semiconductor/glass composite. In general, the formation of small particles is favored by the use of small-pore glasses and by brief, low-temperature annealing. Preferably, the particles of III-V semiconductor material have a diameter less than about 50 nm, and most preferably less than about 20 nm. The present articles of manufacture exhibit minimum light-scattering and are useful as optical filters and for generating third order nonlinear optical effects.

Although the glass/III-V semiconductor articles of manufacture of this invention possess novel and useful electronic and nonlinear optical properties, they tend to be fragile, adversely affected by atmospheric water or polar solvents and difficult to machine or polish. For these reasons, the polymer/glass/III-V semiconductor articles of manufacture are preferred. These preferred articles are mechanically robust, much more resistant to chemical degradation and able to be machined and polished like standard optical glass. In such articles, the void-filling polymer is derived from the polymerization of suitable monomers which have been adsorbed by the porous glass either through diffusion or capillary action. Suitable monomers must be small enough to diffuse into and fill the void spaces of the semiconductor-impregnated glass without cracking it or dissolving or reacting with the III-V semiconductor particles. Preferably, polymerization of a suitable monomer should be controllable by the use of a suitable initiator or by treatment of the monomer-saturated glass with heat, radiation, light or electron beams. Suitable monomers include methacrylate; acrylate; styrene; vinyl acetate; acrylonitrile; methacrylonitrile; vinyldiene halides of the formula $CH_2$=$C(X)_2$, wherein X is independently, Cl or F; substituted butadienes of the formula $CH_2$=$C(R)C(R)$=$CH_2$, wherein each R is, independently, $C_1$ to $C_{10}$ alkyl, Cl or F; acrylamide derivatives of the formula $CH_2$=$CHCON(R)_2$, wherein each R is, independently, H or $C_1$ to $C_{10}$ alkyl; methacrylamide derivatives of the formula $CH_2$=$C(CH_3)CON(R)_2$, wherein each R is, independently, H or $C_1$ to $C_{10}$ alkyl; and any mixtures thereof. Methacrylate esters and styrene are preferred. Methacrylates which are useful in this invention include branched alkyl or n-alkyl esters of $C_{1-12}$ alcohols and methacrylic acid, for example, methyl and ethyl methacrylate. Methyl methacrylate is most preferred.

Any of the known class or azo polymerization initiators is suitable provided it has solubility in the monomer mixture, does not react with or dissolve the III-V semiconductor, and has an appropriate half-life at the temperature of polymerization. "Appropriate half-life", as used herein, is a half-life of about 1-4 hours. Typical of such initiators, but not restricted to them, are azocumene, 2,2'-azobis-(isobutyronitrile), 2,2'-azobis(2-methyl)-butanenitrile, and 2-(t-butylazo)-2-cyanopropane. Other soluble non-azo initiators having an appropriate half-life can also be used, including, among others, benzoyl peroxide and lauroyl peroxide.

It is also possible to fill the void-space of the glass-/III-V semiconductor articles with a high-melting, inert organic material of appropriate dimensions by partially immersing the glass/III-V semiconductor articles in the melted organic material to wick it into the glass pores. This will also provide a mechanically robust article that can be machined and polished, but it will also be less thermally stable and less resistant to solvent-leaching than a polymer-filled composite.

The glass/III-V semiconductor articles of manufacture of this invention are prepared by reacting a Group III alkyl species with a Group V hydride within the pores of porous glass. The composition is then heated and the volatiles removed. The glass/III-V semiconductor/polymer articles of manufacture are prepared by placing the glass/III-V semiconductor composition in a solution of monomer and initiator until the pores of the glass are filled, and then polymerizing the monomer.

The glass/III-V semiconductor/polymer articles of this invention have the mechanical properties similar to normal silicate glasses. They can be cut, machined and then polished by standard ceramic wet polishing techniques. The optical properties of these articles are comparable to those of standard optical glasses. They are unaffected by atmospheric moisture or most polar or nonpolar organic solvents. However, prolonged exposure to solvents which are known to dissolve the embedded polymer will cause some leaching of the polymer. Similarly, exposure to strong bases may leach some of the glass from silicate glass articles. They are thermally stable to the decomposition point of the embedded polymer.

The articles of manufacture of the invention are so-called saturable absorbers, which can be used to Q-switch or mode-lock a laser. In addition, the articles of manufacture of the present invention can be used for applications based on phase conjugation and optical bistability such as optical switching, optical logics, optical computing and image processing. See, for example, "Application of Optical Phase Conjugation," D. M. Pepper, Scientific American, January 1986, pp. 74-83 and *Optical Bistability; Switchinu Light with Light.* H. Gibbs, Academic Press, N.Y. (1987).

The present invention is further described in the following examples, wherein all parts and percentages are by weight and degrees are Celsius. Particle sizes in the examples were determined by line-broadening of X-ray diffraction patterns. In some cases, maximum particle sizes were estimated from measurements of the band-gap energy. A value for the band-gap energy greater than that observed for the bulk material indicates the presence of particles having a diameter of less than the exciton diameter of the bulk semiconductor.

EXAMPLES

General Procedures

Preparation of Glass/semiconductor articles

Commercial Vycor ® porous glass is calcined in flowing oxygen to 500° C. to remove any adsorbed organic species and then evacuated in high vacuum at room temperature. Trialkylgallium or trialkylindium species are adsorbed into the glass by trap-to-trap distillation using liquid $N_2$ and high vacuum conditions ($<10^{-3}$ torr) The impregnated glass is allowed to warm to room temperature in static high vacuum to allow equilibration of the organometallic component throughout the porous network. After equilibration, excess trialkylgallium or trialkylindium may be removed, but it is not necessary. A large excess of phosphine ($PH_3$) or arsine ($AsH_3$) is introduced into the reactant vessel (300 torr) and the vessel heated to 200°–400° C. for 1 h. The glass changes color and gas pressure is generated in the vessel as the III-V semiconductor is formed. The volatiles are removed under high vacuum and the semiconductor-impregnated glass collected in an inert atmosphere.

Alternatively, glass/semiconductor articles can be prepared by using porous glass derived from sol gels in place of Vycor ® porous glass. To prepare a porous silicate glass, for example, tetraalkylorthosilicate (0.1 mol) is diluted with methanol (0.75 mol) and/or formamide (0.25 mol), optionally acidified and poured into vials to gel. Use of methanol/formamide leads to glasses with larger pores, but the drying times are also significantly increased; acidification (e.g., with nitric acid) decreases the pore size of the final glass. The vials can be made of any inert material (e.g., glass, polyethylene, polystyrene), but polymer or polymer-coated vials are preferred because the sol glass sticks to glass vials and may shatter as it shrinks. The vial is capped and heated to about 60° C. for about 8 h, or until a stiff clear gel results. The vial is uncapped and the gel is dried in the vial in flowing air at about 60° C. for about 24 h, or until it shrinks to about ½ its original volume. The partially dried gel is removed from the vial and fully dried in a slow ramp heating process wherein the gel is heated to 450°–500° C. over 24–48 h in rapidly flowing (200 cc/min) oxygen or air.

Preparation of glass/III-V semiconductor/PMMA articles

To protect the semiconductor clusters and maintain dispersion, the porosity of the glass is removed by filling all of the available remaining void volume with polymer. This can be done in an inert atmosphere by partially immersing the glass/III-V semiconductor article in methylmethacrylate (MMA) containing 1 wt. % VAZO-64 ® (Du Pont) to "wick" the monomer up to completely fill the pores of the glass. The impregnated glass is removed from the MMA/VAZO ® and heated in an inert atmosphere to about 60° C. for about 8 h, leading to polymerization of the MMA to give PMMA (polymethylmethacrylate) throughout the glass pores. The use of other monomers may require the use of different initiators or polymerization conditions, as will be apparent to those skilled in the art.

The dense glass/semiconductor/PMMA article may be cut and polished as if it were a normal piece of silica glass having no residual porosity.

Nonlinear Optical Properties of the Composites

A material is said to have third order nonlinearity if its index of refraction, n, depends on the intensity of light, I, $$n = n_0 + n_2 I \tag{1}$$

tior $$\Delta n = n_2 I \tag{2}$$

where $n_0$ represents the index of refraction at very low light intensity and $n_2$ is the nonlinear refraction coefficient which measures the magnitude of the nonlinearity. The commonly used unit for $n_2$ in MKS units is $cm^2/KW$.

Another parameter that is often used to characterize third order nonlinearity is $\chi^{(3)}$, usually expressed in cgs units as esu. Both $n_2$ and $\chi^{(3)}$ are related through the following formula (see "Optical Bistability: Controlling light with light", H. M. Gibbs, Academic Press, New York, 1987):

$$n_2(cm^2/KW) = \frac{1}{3} \left| \frac{4\pi}{n_0} \right|^2 \chi^{(3)}(esu) \tag{3}$$

The third order nonlinearity of a material can be further categorized as resonant and non-resonant Resonant means the laser wavelength overlaps with the absorption band of the material, i.e., the material absorbs the light, and non-resonant means otherwise. In the case of resonant nonlinearity, the absorption coefficient, α, of the material depends on the laser intensity, $$\alpha = \alpha_0 + \alpha_2 I \tag{4}$$

or $$\Delta\alpha = \alpha_2 I \tag{5}$$

where $\alpha_0$ represents the absorption coefficient at very low light intensity and $\alpha_2$ is the nonlinear absorption coefficient which also measures the magnitude f the nonlinearity. Both $\Delta\alpha$ and $\Delta n$ are related through the Kramers-Kronig relationship:

$$\Delta n(E) = \frac{c - h}{2\pi^2} P \int_0^\infty \frac{\Delta\alpha(E')}{(E')^2 - E^2} dE' \quad (6)$$

where c is the speed of light, h is Planck's constant, E is the light frequency and P is the Cauchy principal value of the integral:

$$P \int_0^\infty = \lim_{a \to 0} \left( \int_0^{E-a} + \int_{E+a}^\infty \right) \quad (7)$$

Experimentally, one can measure either $\Delta\alpha$ or $\Delta n$ and obtain all the third order nonlinearity parameters, $\alpha_2$, $n_2$, and $\chi^{(3)}$ through equations (1)–(7). While non-resonant nonlinearity, either $n_2$ or $\chi^{(3)}$ alone is sufficient for characterizing the magnitude of the nonlinearity; an additional parameter, $\alpha_0$, is needed in the case of resonant nonlinearity. This is because the nonlinearity depends on, and is limited by, the absorption coefficient of the material at the laser wavelength. Therefore in the case of resonant nonlinearity, $\alpha_2/\alpha_0$, $n_2/\alpha_0$, and $\chi^{(3)}/\alpha_0$ are the correct parameters to use for measuring the nonlinearity. One can characterize the nonlinearity by measuring $\Delta\alpha$ with the pump-probe technique described below and expressing the nonlinearity either as $\alpha_2/\alpha_0$ or $\Delta\alpha/\alpha_0$.

If a material has significant $n_2$ or $\alpha_2$, many third order nonlinear optical phenomena such as optical bistability and phase conjugation (degenerate four-wave mixing) can be demonstrated. Phase conjugation experiments (described in the following section) have been performed on some of the materials of the invention. The phase conjugation efficiency, defined as the intensity ratio of the phase conjugated beam and the probe beam, is also a measure of the nonlinearity. It has contributions from both $n_2$ and $\alpha_2$ and is proportional to:

$$\left[ \left( \frac{2\pi}{\lambda} n_2 \right)^2 + \left( \frac{\alpha_2}{2} \right)^2 \right] \cdot I^2$$

where $\lambda$ is the laser wavelength and I is the intensity of the pump beam. The phase conjugation efficiency depends on the geometry of the optical set-up, the spatial quality of the laser beam, and also the optical quality of the sample. It is therefore not a good universal parameter for comparing the intrinsic nonlinearity of the material.

Laser-induced absorption changes

The change of sample transmission, $I_t$, as a function of the incident laser power was measured by absorption changes using the pump-probe technique. The laser-induced transmission change measures the magnitude and the speed of the optical nonlinearity. The result is expressed as $\Delta OD/OD_0$, where OD is the low-power optical density defined as $-\log(I_t/I_0)$ and $\Delta OD$ is the induced change in optical density.

$$\left[ \frac{\Delta OD}{OD_0} \text{ is equal to } \frac{\Delta\alpha}{\alpha_0} \right].$$

Samples prepared for evaluation were irradiated by a dye laser, using an optical arrangement corresponding to that depicted in FIG. 1. As indicated in FIG. 1, a 10/90 beam splitter 1 (BS1) divides a dye laser pulse into two parts. One part, the strong pump beam, is directed sequentially to a mirror (M1), an attenuator and another mirror (M4). The other beam, a weak probe beam, is directed through a filter (F) and then to a 50/50 beam splitter (BS2). One part of the signal from BS2 is directed to a mirror (M2), which sends the signal back through BS2 and to a detector, providing the reference signal. The other part of the probe beam from BS2 is directed to a mirror (M3). The pump beam (from M4) and the probe beam (from M3) are directed to the sample, and overlap at the sample spatially and temporally. The intensity of the probe beam transmitted through the sample, $I_t$, is measured by a signal detector and divided by the intensity of the signal from the reference detector by a boxcar integrator to correct for laser intensity fluctuations. The power dependence of $\Delta OD$ was obtained by measuring the change in intensity of the transmitted beam as a function of the pump beam intensity, where the intensity of the pump beam is adjusted by the attenuator.

The results of the measurements carried out in accordance with the above technique are expressed in Table 2.

Degenerate Four-Wave Mixing

Figure 2:
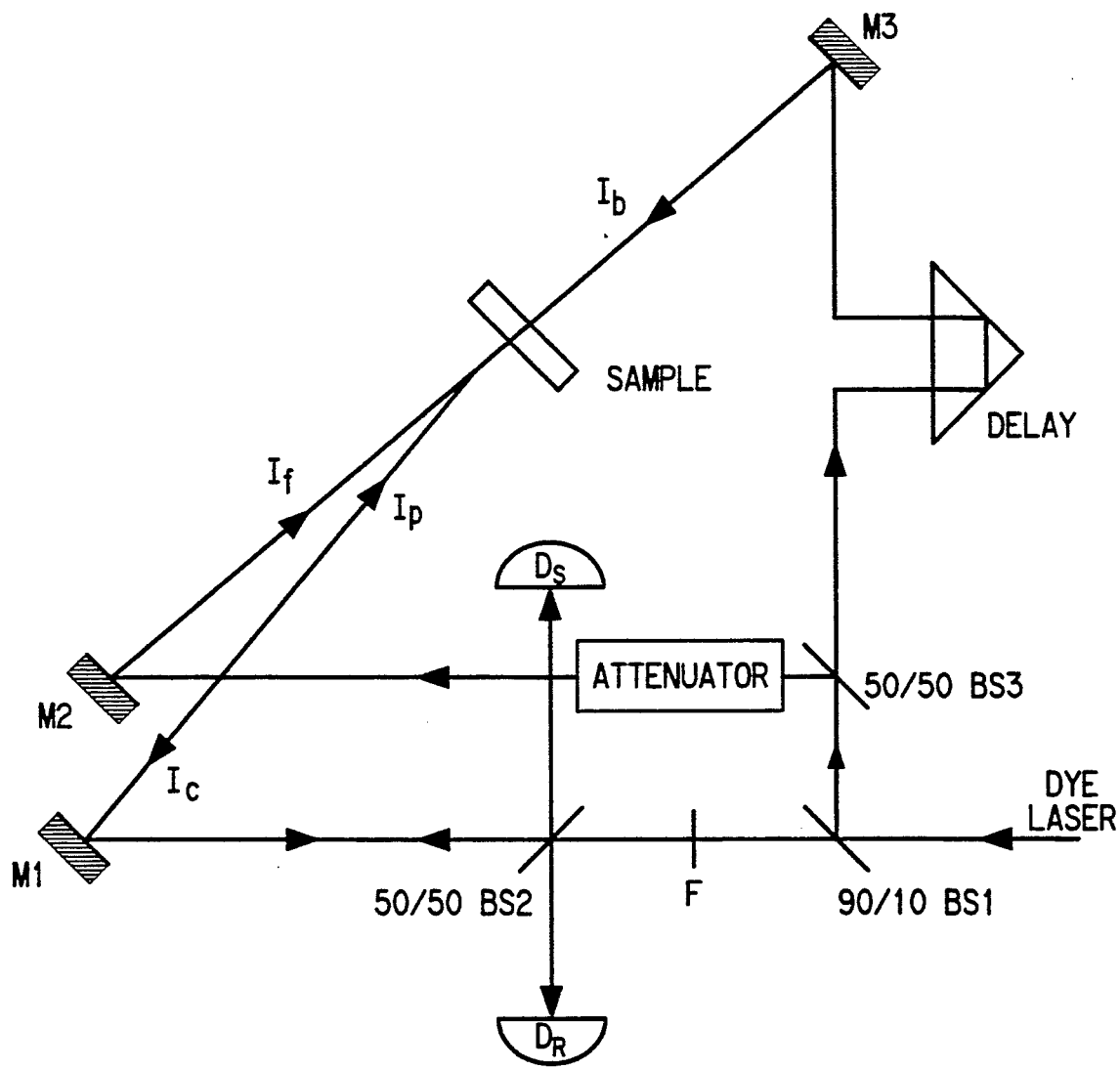
FIG. 2 is a schematic diagram of a Degenerate Mixing Apparatus according to the present invention.

Samples prepared for evaluation are irradiated by a dye laser, using an optical arrangement corresponding to that depicted in FIG. 2. As indicated in FIG. 2, a 10/90 beam splitter 1 (BS1) divides the dye laser pulse into two parts. One part, the weak signal from BS1, is directed to a 50/50 beam splitter (BS2), sending a reference beam to the reference detector ($D_R$) and a probe beam ($I_p$) to a mirror (M1). The other part of the signal from BS1 is directed to a 50/50 beam splitter (BS3). Part of this beam, the forward pump beam ($I_f$), is directed to an attenuator and a mirror (M2). The other part of this beam, the backward pump beam ($I_b$), is directed through a delay and then to a mirror (M3). The forward and backward pump beams (from M2 and M3) and the probe beam (from M1) are directed at the sample and overlap there spatially and temporally. The phase conjugated beam ($I_c$) retraces the path followed by $I_p$ to BS2 and is detected by $D_s$. The magnitude of $I_c$ measures the optical nonlinearity of the sample. $I_c$ is divided by the signal from the reference detector to correct for the laser intensity fluctuations. The power dependence of the nonlinearity is measured by adjusting the intensity of the $I_f$ with the attenuator. The time dependence of the nonlinearity is measured by adjusting the arrival time of the $I_b$ with the delay line.

For samples to be evaluated in these experiments, the dominant contribution to the nonlinearity will be due to laser-induced absorption bleaching and the associated change in refractive index. The pump-probe experiment measures the sample absorption change, and the associated change in refractive index can be obtained through the Kramers-Kronig analysis. The DFWM experiment measures the contribution from both the absorption change and the refractive index change. The observation of large absorption change from the pump-probe experiment can be correlated to the observation of a strong phase-conjugated signal from the DFWM experiment.

EXAMPLE 1

A piece of Vycor® glass ($\frac{1}{2}''\times\frac{1}{2}''\times\frac{1}{4}''$, Corning Glass Co., 7930 porous Vycor® glass 70+21 pores)

was calcined in flowing oxygen to 500° C. to remove water and trapped organics. The clean glass was then evacuated to high vacuum and triethylindium was distilled onto it by trap-to-trap distillation using liquid nitrogen. Excess triethylindium was back-distilled away and the porous glass allowed to equilibrate at room temperature for 15 min in static vacuum. The impregnated glass was then exposed to 300 torr PH₃ gas and heated to 250° C. over 1 h in the phosphine atmosphere. At about 200° C., the pressure began to rise, indicating the onset of the desired reaction and the evolution of ethane, ethylene and hydrogen. The sample was held at 250° C. for 30 min, during which time the color of the glass changed from yellow to deep red/black. The glass was evacuated, cooled to room temperature, placed in an inert atmosphere glove box and impregnated with a 1% solution of Vazo-64 ® in methyl methacrylate (MMA). The thoroughly saturated glass was placed in a tightly capped vial, removed from the glove box and heated in a vacuum oven overnight at 60° C. to give a dense glass/semiconductor/polymer composite. This material shows an X-ray pattern of crystalline InP with a particle size of 85Å.

EXAMPLES 2-5

The procedure described in Example 1 was used to prepare other glass/III-V semiconductor/PMMA articles as summarized in Table 1. In most cases the coloration of the glass appears to be very uniform. In all cases, X-ray patterns of the desired semiconductor have been observed with particle sizes <100Å.

TABLE 1

| | Glass/III-V Semiconductor/PMMA Articles | | | |
|---|---|---|---|---|
| Ex. | Semi-Conductor | Metal Alkyl | Pnictogen Hydride | Color |
| 1 | InP | In(Et)₃ | PH₃ | Yellow → Black |
| 2 | GaAs | Ga(Me)₃ | AsH₃ | Dark red → Black |
| 3 | GaP | Ga(Me)₃ | PH₃ | Yellow |
| 4 | InAs | In(Et)₃ | AsH₃ | Black |
| 5 | InSb | In(Et)₃ | SbH₃ᵃ | Black |

ᵃFrom Sb + H₂ at 500° C. in situ.

EXAMPLES 6-9

Porous sol-gel glass was prepared as follows by mixing tetramethylorthosilicate (15 mL), methanol (12.5 mL), formamide (12.5 mL), nitric acid (2 mL) and water (18 mL). The resulting mixture (pH about 4.5) was poured into polyethylene vials to a depth of ¼". The vials were capped tightly and heated overnight at 60° C., during which time the sol gelled. Excess liquid was decanted and the gels were dried at 60° C. in flowing air for 24 h, during which time the gels had shrunk to about ½ their original volume. Final drying/calcination was done in flowing air by ramping the temperature from ambient to 500° C. over 48 h. The resulting hard, clear disks are very porous and fragile when exposed to polar liquids.

The procedure described in Example 1 was repeated using this porous glass in place of Vycor ® to prepare glass/semiconductor/PMMA articles containing InP (Example 6), InAs (Example 7), GaP (Example 8) or GaAs (Example 9). X-ray diffraction patterns of these materials have shown extremely broad, weak features in the regions expected for the desired semiconductors, indicating a very small particle size (<25Å). The color in these disks is usually not uniform and is concentrated within 1 mm of the surface. This is probably a manifestation of the small pore size of the porous glass, leading to pore blockage during reaction and sealing off the disk interior from further reaction.

Table 2 summarizes the resonant $\chi^{(3)}$ properties of selected glass/III-V semiconductor/polymer articles. In general, the nonlinearities of these Examples are about one order of magnitude lower than the reference material, $CdS_xSe_{1-x}$ doped glass, at the wavelength studied. $CdS_xSe_{1-x}$ is one of the best $\chi^{(3)}$ materials known in the art.

TABLE 2

| Ex. | Sample | Wavelength | Laser Energy | Rel. Absorbance Change. $\Delta OD/OD_0$ | $\chi^{(3)}$ (est.) |
|---|---|---|---|---|---|
| 3 | GaP | 540 nm | 0.99 mj | −10.7% | $10^{-9}$ esu |
| | Vycor ® | 570 nm | 0.58 mj | −8.8% | |
| | | 625 nm | 0.31 mj | −9.3% | |
| 6 | InP in | 540 nm | 0.59 mj | −1.9% | |
| | sol-gel | 570 nm | 0.46 mj | −3.8% | |
| | | 625 nm | 0.31 mj | −5.5% | |
| 7 | InSb in | 540 nm | 0.59 mj | −4% | |
| | sol-gel | 570 nm | 0.46 mj | −6.7% | |
| | | 625 nm | 0.31 mj | −4.3% | |

What is claimed is:

1. An article of manufacture consisting essentially of a porous glass matrix, the pores of which comprise a IIIB-VB semiconductor, and, optionally, a polymer.

2. The article of manufacture of claim 1 wherein the IIIB-VB semiconductor comprises at least one cation selected from the group consisting of $Ga^{+3}$ and $In^{+3}$ in combination with at least one anion selected from the group consisting of $P^{-3}$, $As^{-3}$ and $Sb^{-3}$.

3. The article of manufacture of claim 2 wherein the IIIB-VB semiconductor is selected from the group consisting of GaAs, GaP, InAs and InP.

4. The article of claim 3 wherein the IIIB-VB semiconductor is used to provide a semiconductor to glass weight ratio of from about 0.1 to about 10 percent.

5. The article of manufacture of claim 1 wherein the glass is heat treated borosilicate glass leached with acid to remove silica-poor domains therefrom.

6. The article of manufacture of claim 1 wherein the glass is selected from the group consisting of $SiO_2$, $GeO_2$, $Y_2O_3$ and $ZrO_2$.

7. The article of manufacture of claim 6 wherein the glass is $SiO_2$.

8. The article of manufacture of claim 1 wherein the glass is selected from the group consisting of $SiO_2$—$BaO$, $SiO_2$—$B_2O_3$, $SiO_2$—$B_2O_3$—$Na_2O$, $SiO_2$—$Na_2O$, $Al_2O_3$—$ZrO_2$, $TiO_2$—$ZrO_2$, $ZrO_2$—$SiO_2$ and $PbO$—$La_2O_3$—$ZrO_2$—$TiO_2$.

* * * * *